United States Patent
Juang et al.

(10) Patent No.: US 7,629,906 B2
(45) Date of Patent: Dec. 8, 2009

(54) CIRCUIT AND METHOD FOR CALIBRATING DIRECT CURRENT OFFSET

(75) Inventors: Kai-Cheung Juang, Nantou County (TW); Wei-Hsien Chen, Chiayi County (TW); Horng-Yuan Shih, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/124,174

(22) Filed: May 21, 2008

(65) Prior Publication Data
US 2009/0167577 A1 Jul. 2, 2009

(30) Foreign Application Priority Data
Dec. 26, 2007 (TW) .............................. 96150320 A

(51) Int. Cl.
*H03M 1/06* (2006.01)
(52) U.S. Cl. ..................... 341/118; 341/119; 341/143; 341/144
(58) Field of Classification Search ......... 341/117–120, 341/144, 155, 143
See application file for complete search history.

(56) References Cited

U.S. PATENT DOCUMENTS

| | | | |
|---|---|---|---|
| 6,100,827 A * | 8/2000 | Boesch et al. ............... | 341/118 |
| 6,313,769 B1 * | 11/2001 | Mangahas et al. ........... | 341/118 |
| 6,756,924 B2 * | 6/2004 | Lee et al. ..................... | 341/120 |
| 6,968,172 B2 | 11/2005 | Saito | |
| 6,985,098 B2 | 1/2006 | Lee | |

* cited by examiner

*Primary Examiner*—Jean B Jeanglaude
(74) *Attorney, Agent, or Firm*—Jianq Chyun IP Office

(57) ABSTRACT

A circuit and a method for calibrating the direct-current offset in the signal output from a signal processing unit are provided. The calibration circuit includes a 1-bit quantizer, a control logic unit and a digital-to-analog converter. The 1-bit quantizer is coupled to the output end of the signal processing unit for receiving and detecting a direct-current offset component in the output signal so as to obtain quantization information. The control logic unit is coupled to the 1-bit quantizer for sequentially setting one of a plurality of bits of a compensation value and updating the set bit according to the quantization information. The digital-to-analog converter is coupled to the control logic unit for compensating the direct-current offset component in the signal output from the signal processing unit according to the compensation value.

16 Claims, 6 Drawing Sheets

CIRCUIT AND METHOD FOR CALIBRATING DIRECT CURRENT OFFSET

CROSS-REFERENCE TO RELATED APPLICATION

This application claims the priority benefit of Taiwan application Ser. No. 96150320, filed Dec. 26, 2007. The entirety of the above-mentioned patent application is hereby incorporated by reference herein and made a part of this specification.

BACKGROUND OF THE INVENTION

1. Field of the Invention

The present invention generally relates to a circuit and a method for calibrating direct current (DC) offset.

2. Description of Related Art

The wireless communication products getting popularized in recent years mostly require miniaturization and having multiple modes in design. To meet the above-mentioned requirements, the traditional superheterodyne system used as the radio frequency (RF) component of the products has been gradually replaced by a direct conversion system or a low intermediate frequency (low IF) system, and such architecture has become the design tendency today. The reason why a direct conversion system is broadly adopted lies in that the RF signals can be directly transformed into baseband signals without the need of intermediate frequency (IF) signal processing. The complexity of the direct conversion system is much simpler than that of the superheterodyne system since the procedure of intermediate frequency (IF) signal processing is omitted. As a result, the chip can be designed in a compact size so as to have multiple modes.

In a receiver employing the direct conversion system, the major direct-current (DC) offset is generated by self-mixing of a local oscillator and the input signal of the receiver, wherein the DC offset component is determined according to the energy and frequency of the local oscillator and the input signal. Another reason lies in the mismatch of the load of an employed mixer in the process. Moreover, the DC offset may be generated because of the mismatch of the employed amplifier and filter in the process, where the DC offset component is varied with the cutoff frequency of the filter and the gain of the gain amplifier.

In the design of a conventional circuit, a high pass filter (HPF) is disposed on the signal path, so as to remove the DC offset generated thereon. FIG. 1 is a diagram showing a conventional circuit for calibrating DC offset according to U.S. Pat. No. 6,968,172 B2, wherein although the structure of using HPF 110 and 130 is able to remove the DC offset component on the signal path of an amplifier 120, but the useful low-frequency signal is removed as well.

FIG. 2 is a diagram showing a conventional circuit for calibrating DC offset according to U.S. Pat. No. 6,968,172 B2. Referring to FIG. 2, the DC offset in the signal output from an amplifier 210 is fed back to the amplifier 210 through a comparator 220 and a low pass filter (LPF) 230 so as to compensate the DC offset of the output signal. In fact, the circuit can be considered as an HPF, which means a low-frequency signal would be filtered when passing through the circuit, and the signal is required to be fed back such that the DC offset component of the signal would be compensated. Accordingly, the response speed of the circuit for the signal is reduced.

FIG. 3 is a diagram showing a conventional circuit for calibrating DC offset according to U.S. Pat. No. 6,968,172 B2. Referring to FIG. 3, the circuit depicted herein adopts one of the most common means for calibrating the DC offset in a direct conversion communication system, wherein a comparator 320 is used to detect a DC offset component, and an analog-to-digital converter (ADC) is used to convert the DC offset component into a digital signal, which is then sent to a digital signal processor (DSP) 340 for processing. After the processing of the DSP 340, the DC offset component is obtained and converted into an analog signal by a digital-to-analog converter (DAC) 350 for compensating the DC offset component of the amplifier 310.

SUMMARY OF THE INVENTION

Accordingly, the exemplary invention is directed to a circuit for calibrating direct current (DC) offset, which adopts a successively-approximating architecture combining a 1-bit quantizer and a control logic unit to obtain a compensation value of the DC offset, such that the size of the circuit can be reduced.

The exemplary invention is also directed to a method for calibrating DC offset, which uses a binary search approach for successively-approximating a compensation value of the DC offset, such that a proper value used for calibrating the DC offset component can be obtained quickly.

The exemplary invention provides a circuit for calibrating a DC offset component in the signal output from a signal processing unit. The circuit includes a 1-bit quantizer, a control logic unit and a digital-to-analog converter (DAC), wherein the 1-bit quantizer is coupled to an output end of the signal processing unit for receiving and detecting the DC offset component in the output signal so as to obtain quantization information. The control logic unit is coupled to the 1-bit quantizer for sequentially setting one of a plurality of bits of a compensation value and updating the set bits according to the quantization information. The DAC is coupled to the control logic unit for compensating the DC offset component in the signal output from the signal processing unit.

The exemplary invention also provides a method for calibrating DC offset suitable for calibrating the DC offset in a signal output from the signal processing unit. The method includes following steps. First, one of a plurality of bits of a compensation value is sequentially set. Next, the DC offset calibration in the signal output from the signal processing unit is calibrated according to the compensation value. Then, the DC offset component in the output signal are detected and quantized into quantization information. Further, the bits of the compensation value are updated according to the quantization information.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
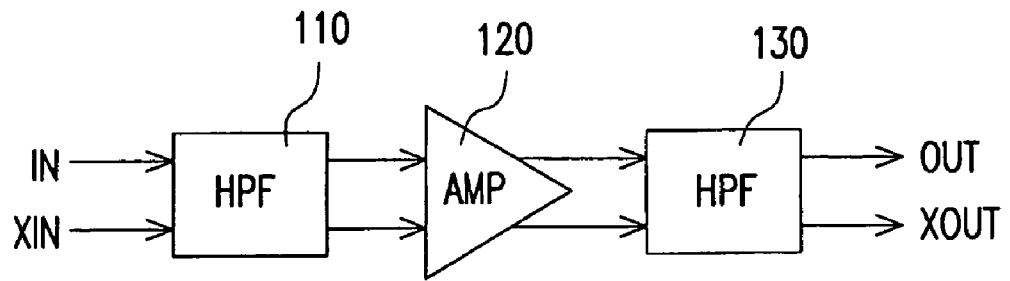
FIG. 1 is a diagram showing a conventional circuit for calibrating direct current offset.
Figure 2:
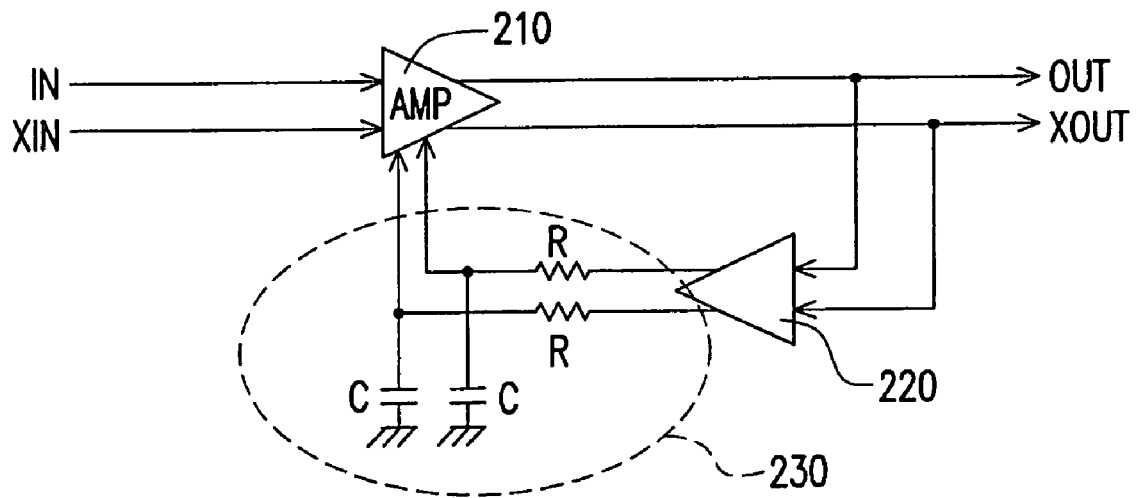
FIG. 2 is a diagram showing a conventional circuit for calibrating direct current offset.
Figure 3:
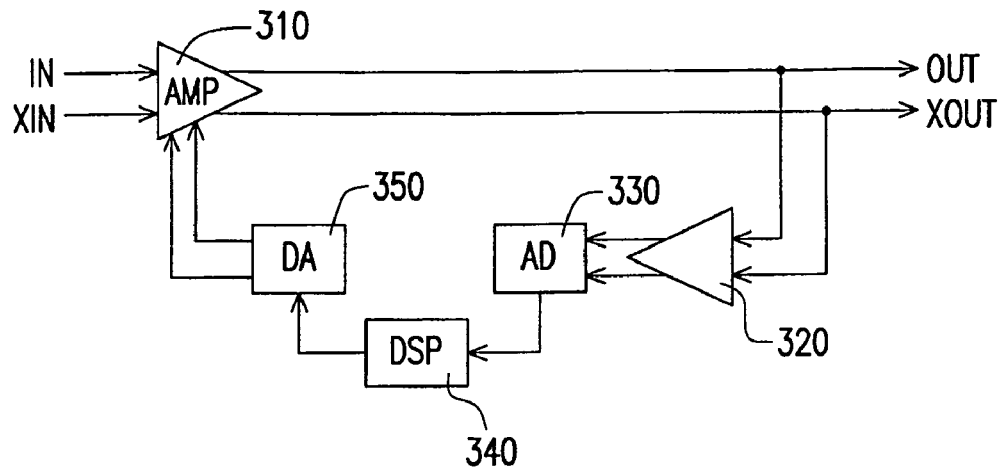
FIG. 3 is a diagram showing a conventional circuit for calibrating direct current offset.

Reference will now be made in detail to the exemplary preferred embodiments of the invention, examples of which are illustrated in the accompanying drawings. Wherever possible, the same reference numbers are used in the drawings and the description to refer to the same or like parts.

A conventional circuit for calibrating direct current (DC) offset usually employs an analog-to-digital converter (ADC) of multi-bits to detect a DC offset component in an output signal and then update a compensation value of the DC offset component. In contrast, the method and circuit for calibrating DC offset adopt a successively-approximating scheme to sequentially obtain the bits of a compensation value. After all the bits of the compensation value (for example, 8 bits in total) are set and updated, the correct compensation value for DC offset calibration is obtained. In order to better explain the present invention, several embodiments are given hereinafter.

Figure 4:
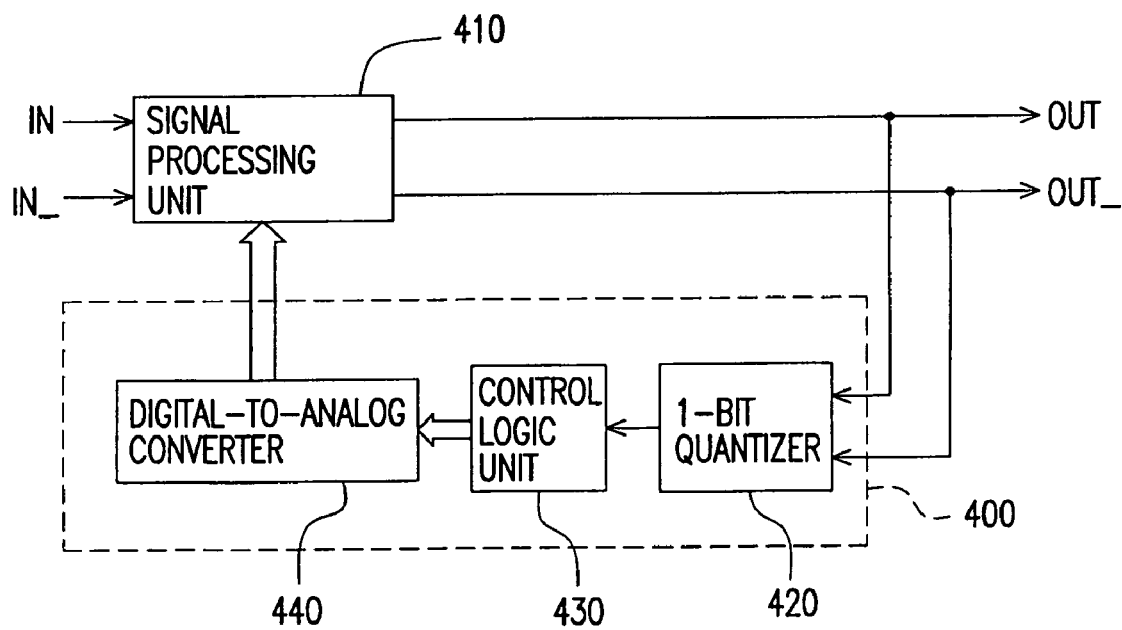
FIG. 4 is a block diagram of a circuit for calibrating direct current offset according to an embodiment of the present invention.

FIG. 4 is a block diagram of a circuit for calibrating DC offset according to an embodiment of the present invention. Referring to FIG. 4, a calibration circuit 400 is used for calibrating the DC offset component in a signal output from a signal processing unit 410, wherein the signal processing unit 410 is, for example, an amplifier for receiving an input signal, conducting a signal processing on the received signal (amplifying the received signal) and outputting the processed signal.

The calibration circuit 400 includes a 1-bit quantizer 420, a control logic unit 430 and a DAC 440, and the functions thereof are as follows.

The 1-bit quantizer 420 is coupled to the output end of the signal processing unit 410 for receiving the output signal, detecting the DC offset component in the output signal and quantizing the detected DC offset component into quantization information. The output quantization information includes logic-high and logic-low.

The control logic unit 430 is coupled to the 1-bit quantizer 420 for sequentially setting one of a plurality of bits of a compensation value and receiving the quantization information output from the 1-bit quantizer 420 so as to update the set bits. The signal processing unit 410 is, for example, a successively-approximating register (SAR) adopting a binary search architecture. The SAR is able to sequentially set and update each of the bits of the compensation value.

In detail, the signal processing unit 410 sets and updates the bits of the compensation value in sequence from the most significant bit (MSB) until all the bits of the compensation value are set and updated. For example, assuming the compensation value includes 8 bits in total, the signal processing unit 410 sets the MSB thereof (i.e., the first bit) as a binary number '1' and sets the rest bits as a binary number '0', so as to conduct DC offset calibration. The 1-bit quantizer 420 detects and analyzes the obtained quantization information to judge whether or not updating or keeping the originally set value. By sequentially setting and updating the rest bits of the compensation value, an accurate compensation value can be obtained.

The DAC 440 is coupled to the control logic unit 430 for controlling the signal processing unit 410 to compensate the DC offset component in the output signal according to the compensation value set by the control logic unit 430, wherein the DAC 440 is, for example, coupled to the control end of the signal processing unit 410 for controlling the signal processing unit 410 to conduct DC offset calibration.

By adopting the architecture of the aforesaid circuit for calibrating DC offset, the present invention is able to obtain an accurate compensation value within limited cycles without resulting in a non-convergence problem for the circuit. By disposing a 1-bit quantizer, the complexity of the circuit is effectively reduced so as to increase the response speed thereof for signal calibration. In addition to the above-mentioned circuit architecture, the present invention also provides a complete method for calibrating DC offset in accordance with the operation of the circuit for calibrating DC offset, which is illustrated in the following embodiment.

Figure 5:
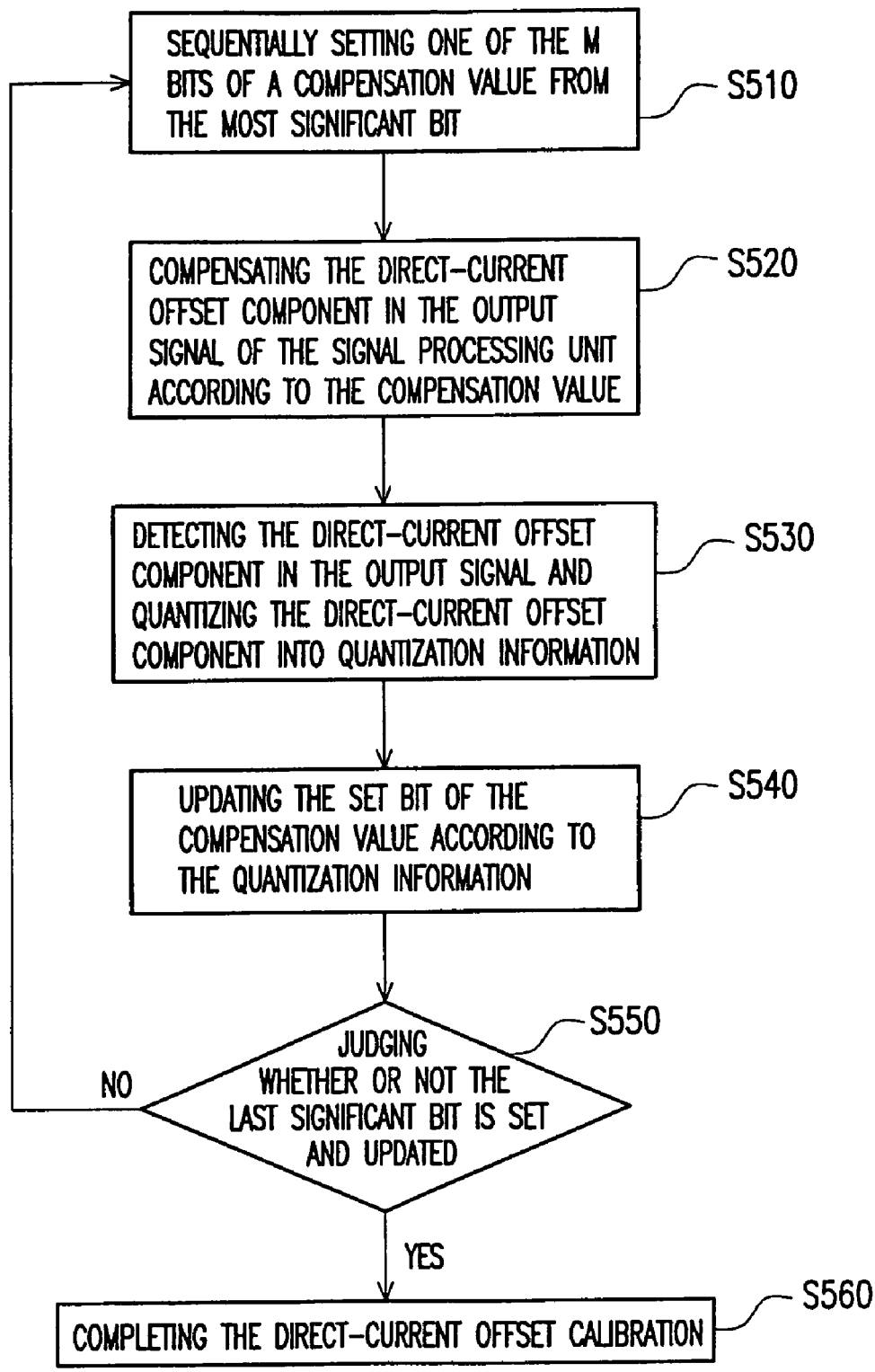
FIG. 5 is a flowchart of a method for calibrating direct current offset according to an embodiment of the present invention.

FIG. 5 is a flowchart of a method for calibrating DC offset according to an embodiment of the present invention. Referring to FIG. 5, the method of the present invention is suitable for the calibration circuit 400 as described in the previous embodiment and used for calibrating the DC offset component in the signal output from the signal processing unit. The steps of the method are as follows.

First, one of a plurality of bits of a compensation value is set (step S510). As described in the previous embodiment, the compensation value includes a plurality of bits and the above-mentioned setting and updating step is conducted on each of the bites of the compensation value in sequence from the MSB to the LSB, where the preferred compensation value is obtained by using a successively-approximating scheme.

Next, the DC offset component in the signal output from the signal processing unit is compensated according to the set compensation value (step S520), wherein the way to compensate the DC offset component is to use the signal processing unit to compensate the DC offset component in the output signal.

After the signal processing unit completes DC offset calibration, the DC offset component in the output signal is further detected and converted into quantization information (step S530), wherein the quantization information includes a first value (for example, logic-high) and a second value (for example, logic-low).

The quantization information is used to decide whether or not to update the bits of the set compensation value (step S540), wherein step S540 further includes updating the bits of the set compensation value when the quantization information is equivalent to the first value, and remaining the bits of the last-set compensation value unchanged when the quantization information is equivalent to the second value. For example, assuming all the bits of the compensation value are preset by '1', if the quantization information obtained by quantizing the DC offset component is logic-high, it indicates that the preset value of the bit is not correct and should be updated to '0'. In contrast, if the quantization information is logic-low, it indicates that the preset value of the bit is correct and should be kept unchanged.

Whenever one bit of the compensation value is updated, it needs to judge whether or not there are other bits of the compensation value not set and updated (step S550). If there are bits not set, the procedure returns back to step S510, in which a next bit of the compensation value is chosen to be set and steps S510-S540 are repeated to update the value of the bit according to the quantization information until all the bits of the compensation value are set and updated, so as to complete the DC offset calibration (step S560).

By using the above-mentioned successively-approximating scheme, an accurate compensation value for DC offset calibration can be obtained within limited cycles. For example, assuming the compensation value of a DAC needs to be set as '0100-1011' for completely compensating a DC offset component. When the calibration procedure begins, in the first cycle, the MSB of the compensation value is set as '1' and the rest bits are set as '0' (i.e., '1000-0000'). At this time, the set compensation value is inputted into the DAC for controlling the signal processing unit for DC offset calibration. After the DC offset component in the output signal is detected and quantized, the obtained quantization information is logic-high, which means the conducted compensation is too much, and therefore the MSB of the compensation value should be updated to '0'. Next, in the second cycle, the second bit of the compensation value is set as '1' and the other bits after the second bit are set as '0' (i.e., '0100-0000'). At this time, the obtained quantization information is logic-low, which means the conducted compensation is too less, and therefore the second bit of the compensation value should be kept as '1'. Then, in the third cycle, the third bit of the compensation value is set as '1' and the other bits after the third bit are set as '0' (i.e., '0110-0000'). At this time, the obtained quantization information is logic-high, which means the conducted compensation is too much and therefore the third bit of the compensation value should be updated to '0'. Upon similar manner, after eight cycles, an accurate compensation value of '0100-1011' is obtained.

It can be seen from the above that an M-bits DAC (corresponding to a compensation value of M-bits) only needs M cycles to find out an accurate compensation value, and therefore the response speed of the circuit for the signal is increased. Moreover, the present invention also includes applying the above-described circuit and method for DC offset calibration to an N stage signal processing circuit.

Figure 6:
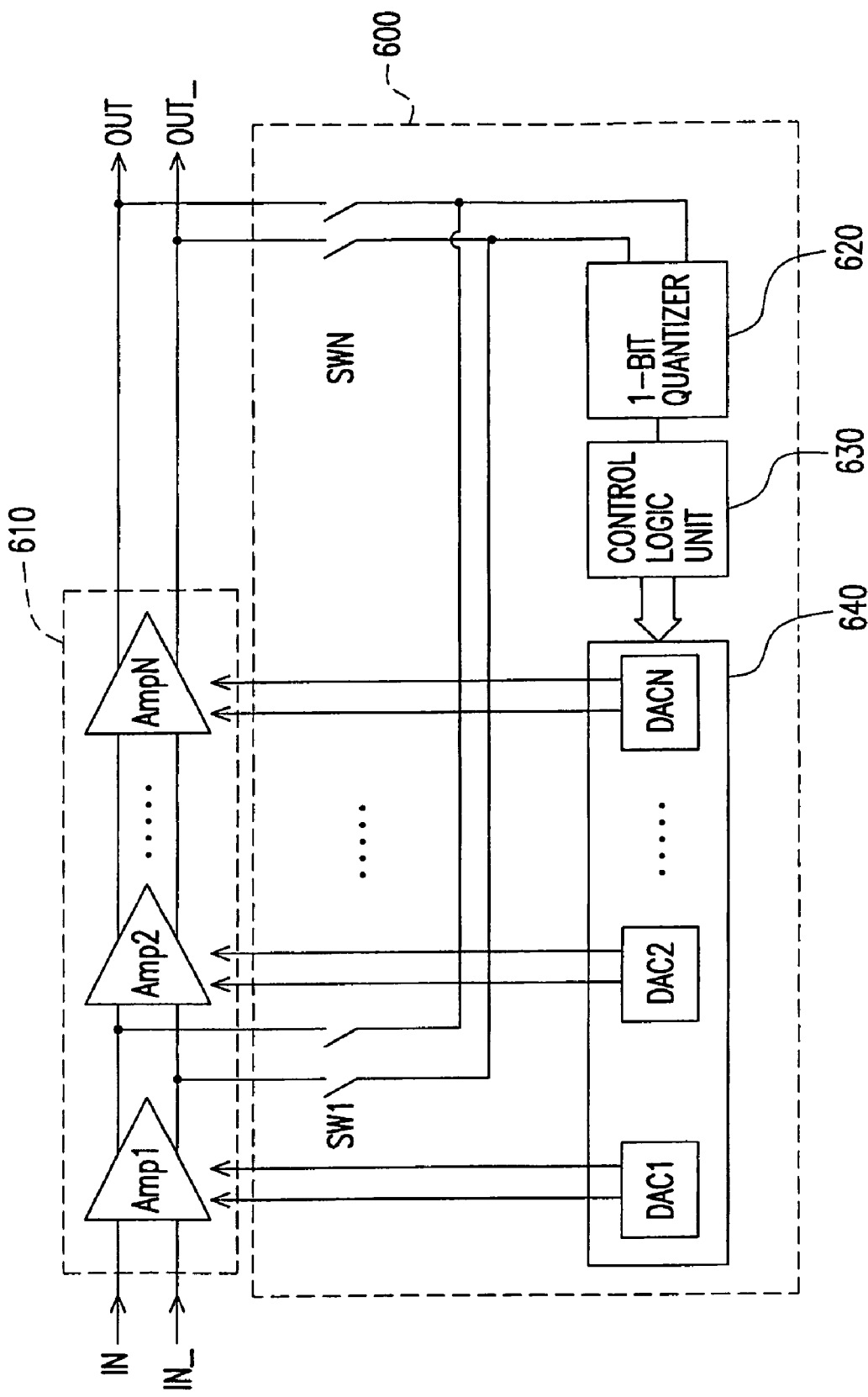
FIG. 6 is a block diagram of a circuit for calibrating direct current offset according to another embodiment of the present invention.

FIG. 6 is a block diagram of a circuit for calibrating DC offset according to another embodiment of the present invention. Referring to FIG. 6, a calibration circuit 600 of the present embodiment is used for calibrating the DC offset component in the signal output from the signal processing unit 610, wherein the signal processing unit 610 includes N signal processing circuits (Amp 1-Amp N, N is a positive integer) for receiving an input signal, conducting signal processing on the signal (i.e., amplifying the signal) and outputting the amplified signal, wherein each of the signal processing circuits is an amplifier, but not limited to it.

The calibration circuit 600 includes a 1-bit quantizer 620, a control logic unit 630 and a DAC unit 640, and the functions thereof are explained respectively in the following.

The 1-bit quantizer 620 is coupled to the output end of the signal processing unit 610 for receiving an output signal, detecting the DC offset component in the output signal and quantizing the DC offset component into quantization information. The 1-bit quantizer 620 is, for example, a comparator and the quantization information output therefrom includes logic-high and logic-low. It should be noted herein that the input end of the 1-bit quantizer 620 in the embodiment is coupled to the output end of each of the signal processing circuit (Amp 1-Amp N) in the signal processing unit 610 through a plurality of switches (SW 1-SW N), so as to conduct a DC offset calibration on the signal output from each of the signal processing circuits (Amp 1-Amp N).

The control logic unit 630 is coupled to the 1-bit quantizer 620 for setting one of a plurality of bits of a compensation value in sequence and simultaneously receiving the quantization information output from the 1-bit quantizer 620 and thereby updating the set bits. The control logic unit 630 is, for example, a successively-approximating register (SAR) adopting binary search approach and is able to set and update each of the bits of the compensation value in sequence. Once all the bits are determined, the most accurate compensation value is obtained and an result for DC offset calibration is achieved.

The DAC unit 640 includes N DACs (DAC 1-DAC N), wherein each DAC is coupled to the control logic unit 630 and a corresponding signal processing circuit for controlling the signal processing circuit to compensate the DC offset component in the output signal according to the compensation value set by the control logic unit 630. The DACs herein are, for example, respectively coupled to the control end of the corresponding signal processing circuit so as to control the signal processing circuit for DC offset calibration.

It should be noted herein that a switch is disposed between each signal processing circuit and the calibration circuit according to the embodiment, and the signal processing circuits are switched for DC offset calibration if necessary. For example, when one of the signal processing circuits (for example, Amp 1) needs to be calibrated, the switch SW 1 is turned on and the rest switches SW 2-SW N are turned off. Moreover, when multiple signal processing circuits (for example, Amp 1-Amp 3) need to be calibrated, the switches SW 1-SW 3 are turned on and the rest switches SW 4-SW N are turned off. An embodiment is given below for describing the detail steps for calibrating DC offset on the signal processing circuit of multiple stages.

Figure 7:
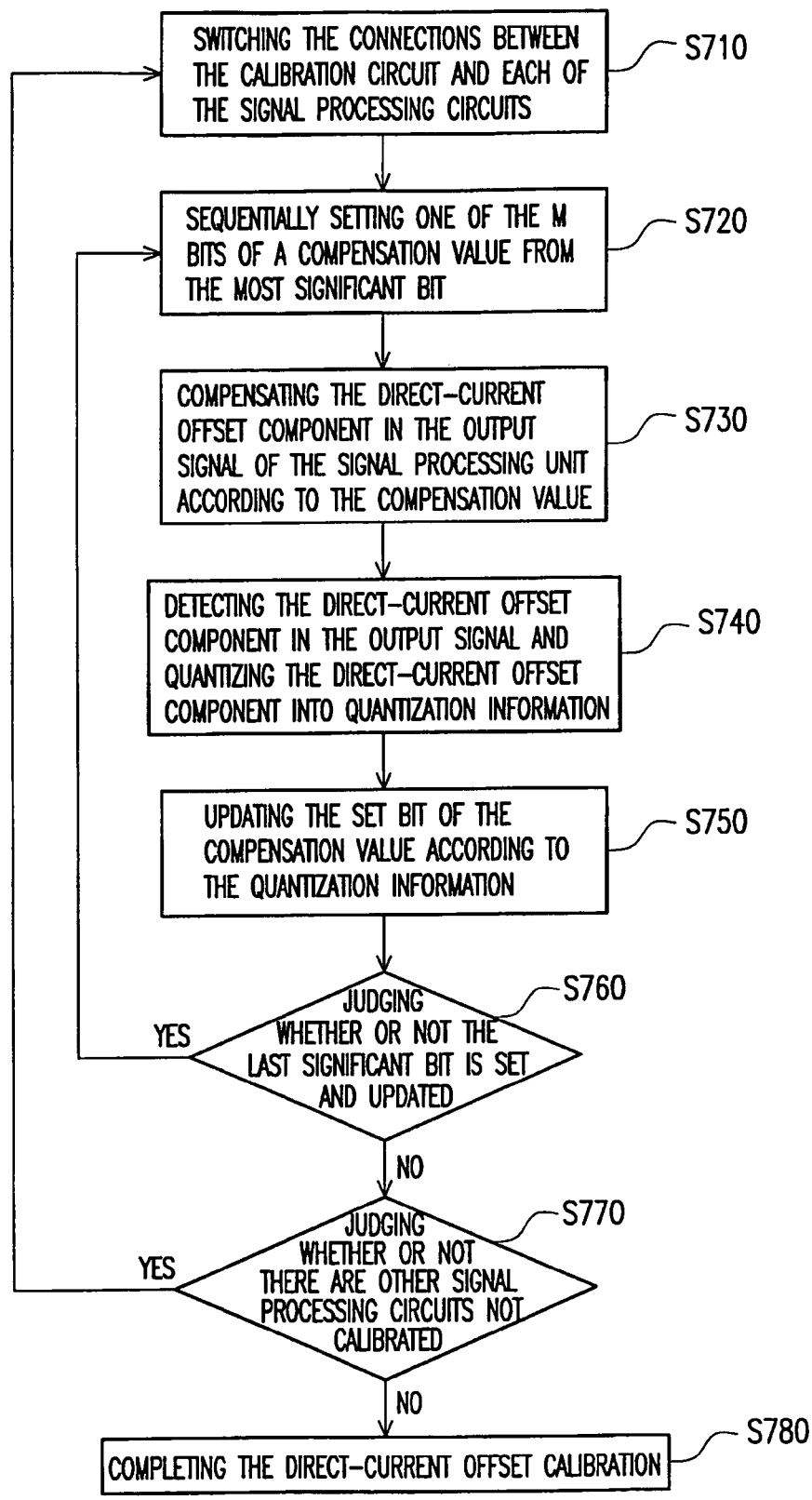
FIG. 7 is a flowchart of a method for calibrating direct current offset according to another embodiment of the present invention.

FIG. 7 is a flowchart of a method for calibrating DC offset according to another embodiment of the present invention. Referring to FIG. 7, the method of the embodiment is suitable for the calibration circuit 600 in the above-mentioned embodiment for calibrating DC offset on the signal output from each of the signal processing circuits in the signal processing unit 610.

The embodiment adopts a fashion of individual calibration to conduct DC offset calibration on each of the signal processing circuits in the signal processing unit 610. First, the connections between the calibration circuit and each of the signal processing circuits are switched so as to conduct DC offset calibration on one of the signal processing circuits (step S710), wherein the above-mentioned switching is to connect the calibration circuit to the output end of one of the signal processing circuits and simultaneously turn off the connections between the calibration circuit and other signal processing circuits so as to conduct DC offset calibration on the individual signal processing circuit.

Next, one of multiple bits of a compensation value is set (step S720). The compensation value may include multiple bits, and the embodiment sets the bits of the compensation value in sequence from the MSB and uses a successively-approximating scheme to obtain the compensation value until all the bits of the compensation value are set and updated.

Then, the DC offset component in the signal output from the signal processing unit is compensated according to the set compensation value (step S730), wherein the DC offset component is compensated by, for example, controlling the signal processing circuit to compensate the DC offset component in the output signal thereof.

After the signal processing circuit completes the DC offset calibration, it further detects the DC offset component in the output signal thereof and quantizes the DC offset component into quantization information (step S740), wherein the quantization information includes a first value (for example, logic-high) and a second value (for example, logic-low).

The quantization information is then used for deciding whether or not to update the set bits of the compensation value (step S750), wherein the step further includes updating the set bits of the compensation value when the quantization information is equivalent to the first value and keeping the last-set bits of the compensation value unchanged when the quantization information is equivalent to the second value.

After updating one bit of the compensation value, it is judged whether there are other bits of the compensation value not set and updated (step S760). If there are other bits not set, the procedure returns back to step S720 to set the next bit of the compensation value in sequence and steps S720-S760 are repeated for setting and updating the rest bits until all the bits of the compensation value are set and updated, so as to complete the DC offset calibration of the signal processing circuit. Then, it is determined whether there are other signal processing circuits not calibrated (step S770). If there are other signal processing circuits not calibrated, the procedure returns back to step S710 to switch the signal processing circuit connected by the calibration circuit and conduct the DC offset calibration on the next signal processing circuit. The steps S720-S760 are repeated so as to obtain the compensation value of the signal processing circuit. When all the signal processing circuits are calibrated, the procedure of the DC offset calibration is completed (step S780).

It should be noted herein that the above-mentioned method for DC offset calibration conducts the DC offset calibration on each the signal processing circuit individually. However, a user may select multiple signal processing circuits for DC offset calibration according to the need, and the way to conduct the DC offset calibration is to connected the calibration circuit of the present invention to those signal processing circuits that are connected in series, so as to conduct the DC offset calibrations on those signal processing circuits as a whole.

Figure 8:
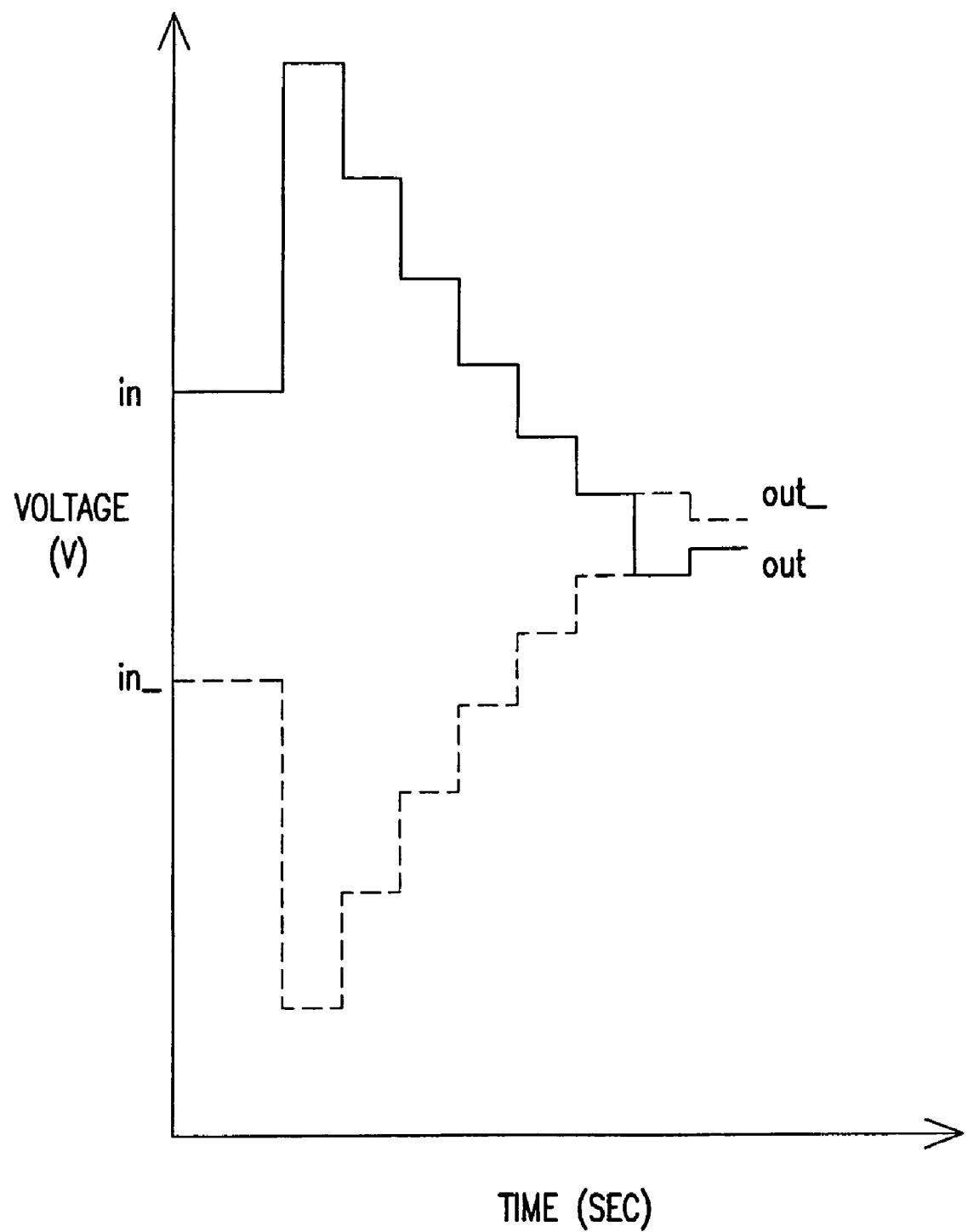
FIG. 8 is a voltage-time graph of an example implementing the method for calibrating direct current offset according to an embodiment of the present invention.

FIG. 8 is a voltage-time graph of an example implementing the method for calibrating DC offset according to an embodiment of the present invention. Referring to FIG. 8, the graph is a result of DC offset calibration on the signal processing circuit according to one embodiment of the present invention, wherein abscissa represents time and ordinate represents voltage of the signal output from the signal processing circuit. As shown by FIG. 8, since the calibration circuit of the present embodiment adopts a successively-approximating scheme, the detected voltages of the output signal are serrated-like and the voltage curve is convergent to a specific value (convergent to '0000-0011' in the embodiment), wherein the specific value is the accurate value for DC offset calibration.

In summary, the present invention employs an additional circuit for calibrating DC offset to replace the conventional filter architecture and uses a successively-approximating register (SAR) to search out and obtain a compensation value in a successively-approximating scheme, which is advantageous in fast calibration and increases the response speed for the circuit. In addition, the adopted 1-bit quantizer architecture can simplify the complexity of the circuit, and reduce the chip area and power consumption.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit for calibrating direct current offset, used for calibrating a direct-current offset component in a signal output from a signal processing unit, the circuit comprising:
    a 1-bit quantizer, coupled to an output end of the signal processing unit for receiving and detecting the direct-current offset component in the output signal to obtain quantization information;
    a control logic unit, coupled to the 1-bit quantizer for setting one of a plurality of bits of a compensation value and updating the bit according to the quantization information in sequence; and
    a digital-to-analog converter, coupled to the control logic unit for compensating the direct-current offset component in the output signal of the signal processing unit.

2. The circuit for calibrating direct current offset according to claim 1, wherein the compensation value comprises M bits, where M is a positive integer, and the control logic unit is used for setting and updating the bits of the compensation value in sequence from the most significant bit (MSB) to the least significant bit (LSB).

3. The circuit for calibrating direct current offset according to claim 1, wherein the signal processing unit comprises N stages of signal processing circuits, where N is a positive integer.

4. The circuit for calibrating direct current offset according to claim 3, further comprising:
    N switches, each of which is disposed between a corresponding signal processing circuit and the circuit for calibrating direct current offset and used to switch the signal processing circuits to be calibrated.

5. The circuit for calibrating direct current offset according to claim 4, wherein when the direct-current offset calibration is conducted on one of the signal processing circuits or on a combination thereof, the corresponding switches of the signal processing circuits are turned on and the rest switches are turned off, so as to conduct direct-current offset calibration.

6. The circuit for calibrating direct current offset according to claim 4, further comprising:
    N digital-to-analog converters, coupled to the control logic unit for compensating the direct-current offset component in the output signal of the presently-switched signal processing circuit according to the compensation value.

7. The circuit for calibrating direct current offset according to claim 1, wherein the digital-to-analog converter is coupled to a control end of the signal processing unit for controlling the signal processing unit to compensate the direct-current offset component in the output signal.

8. The circuit for calibrating direct current offset according to claim 1, wherein the 1-bit quantizer comprises a comparator and the quantization information output from the comparator comprises logic-high and a logic-low.

9. The circuit for calibrating direct current offset according to claim 1, wherein the control logic unit comprises adopting a binary search architecture.

10. The circuit for calibrating direct current offset according to claim 9, wherein the control logic unit comprises a successively-approximating register (SAR).

11. A method for calibrating direct current offset, suitable for calibrating a direct-current offset component in a signal output from a signal processing unit, the method comprising:
    sequentially setting one of a plurality of bits of a compensation value;
    compensating the direct-current offset component in the output signal of the signal processing unit according to the compensation value;

detecting the direct-current offset component in the output signal and quantizing the direct-current offset component into quantization information; and updating the set bit of the compensation value according to the quantization information.

12. The method for calibrating direct current offset according to claim 11, wherein the compensation value comprises M bits, where M is a positive integer, and the step of sequentially setting one of the bits of the compensation value comprises:

setting and updating the bits of the compensation value in sequence from the most significant bit (MSB) to the least significant bit (LSB).

13. The method for calibrating direct current offset according to claim 11, wherein the signal processing unit comprises N stages of signal processing circuits, where N is a positive integer and the method for calibrating direct current offset further comprises:

switching the signal processing circuits; and repeating the above-mentioned steps for conducting direct-current offset calibration on each of the signal processing circuits until all the signal processing circuits are calibrated.

14. The method for calibrating direct current offset according to claim 13, wherein the step of switching the signal processing circuits comprises:

switching the signal processing circuits one by one to conduct direct-current offset calibration on each of the signal processing circuits.

15. The method for calibrating direct current offset according to claim 13, wherein the step of switching the signal processing circuits comprises:

switching a plurality of signal processing circuits to conduct direct-current offset calibration on the signal processing circuits as a whole, wherein the signal processing circuits are connected in a series.

16. The method for calibrating direct current offset according to claim 11, wherein the quantization information comprises a first value and a second value, and the step of updating the set bit of the compensation value according to the quantization information comprises:

updating the set bit of the compensation value when the quantization information is equivalent to the first value; and keeping the last-set bit of the compensation value unchanged when the quantization information is equivalent to the second value.

* * * * *